(12) United States Patent
Hernandez

(10) Patent No.: US 7,919,022 B2
(45) Date of Patent: Apr. 5, 2011

(54) METHOD FOR MANUFACTURING LENSES, IN PARTICULAR FOR CMOS IMAGER

(75) Inventor: Caroline Hernandez, Peyrolles (FR)

(73) Assignee: STMicroelectronics SA, Montrouge (FR)

( * ) Notice: Subject to any disclaimer, the term of this patent is extended or adjusted under 35 U.S.C. 154(b) by 921 days.

(21) Appl. No.: 11/752,187

(22) Filed: May 22, 2007

(65) Prior Publication Data

US 2007/0273054 A1 Nov. 29, 2007

(30) Foreign Application Priority Data

May 23, 2006 (FR) ...................................... 06 04636

(51) Int. Cl.
*B29C 11/00* (2006.01)

(52) U.S. Cl. .................. 264/1.7; 264/1.38; 427/162

(58) Field of Classification Search .................. 264/1.1, 264/1.7, 1.36, 1.38; 427/162
See application file for complete search history.

(56) References Cited

U.S. PATENT DOCUMENTS

| 5,498,444 | A | * | 3/1996 | Hayes | 427/162 |
| 5,534,101 | A | * | 7/1996 | Keyworth et al. | 156/244.12 |
| 5,945,041 | A | | 8/1999 | Melzner | 264/1.1 |
| 2005/0035474 | A1 | * | 2/2005 | Itoh | 264/1.38 |

FOREIGN PATENT DOCUMENTS

| DE | 196 31 736 | 2/1998 |
| EP | 1 045 453 | 10/2000 |
| EP | 1 251 365 | 10/2002 |
| JP | 62-111202 | 5/1987 |
| JP | 04-261501 | 9/1992 |
| JP | 2002-23015 | 1/2002 |
| WO | 91/04846 | 4/1991 |

* cited by examiner

*Primary Examiner* — Mathieu D. Vargot
(74) *Attorney, Agent, or Firm* — Lisa K. Jorgenson; William J. Pigott; Seed IP Law Group PLLC

(57) ABSTRACT

A method manufactures a digital image sensor including at least one optical lens using a hardenable liquid or gelatinous material. The method includes depositing a calibrated volume of the material on a lens formation base using a tubular needle of a small diameter, so that the volume of material deposited has at least one convex part under the effect of interface energies, and hardening all or part of the volume of deposited material.

28 Claims, 6 Drawing Sheets

METHOD FOR MANUFACTURING LENSES, IN PARTICULAR FOR CMOS IMAGER

BACKGROUND OF THE INVENTION

1. Field of the Invention

The present invention relates to the manufacturing of optical lenses and particularly of lenses for CMOS imagers.

2. Description of the Related Art

Imagers produced according to the CMOS ("Complementary Metal Oxide Semiconductor") technology are currently the subject of an increasing number of applications due to their low cost price in comparison with CCD (Charge Coupled Device) imagers. Such CMOS imagers were initially used to produce low resolution image sensors of mediocre quality (for example web cameras). Today, after major investment in research and development, CMOS imagers can compete with CCD imagers. The present invention is in line with an effort to improve this imager technology aiming to reduce the cost with the same quality.

FIG. 1 represents an example of a module for capturing images and/or video using a CMOS imager, intended for example to be mounted into a portable device such as a mobile telephone, a camera or a video camera. The module 1 comprises a frame 2, an optical set or lens-holder block 3, a lens 4 fitted into the block 3, an infrared filter 5 and a base 6. A CMOS imager 10 is arranged on the base 6 and receives the light passing through the microlenses and the infrared filter.

The CMOS imager 10 is in the shape of a semiconductor chip and comprises a plurality of photosites each forming one pixel (not visible in FIG. 1). Each pixel comprises a photodiode and a control and interconnection circuit of the photodiode. The pixels are arranged as an array and a mosaic of red, green and blue filters is distributed over the pixel array, generally according to the Bayer architecture (the cells of a line being alternately red and green, or alternately green and blue). Each pixel is thus covered with a determined, red, green or blue, primary color filter and provides a piece of luminance information about the primary color allocated to it, forming a piece of pixel information.

FIG. 2 is a schematic cross-section of the CMOS imager 10 in a region corresponding to three pixels PIX1, PIX2, PIX3. Going from bottom to top, layers 11, 12, 13, 14, 15 and microlenses L0 (L0-1, L0-2, L0-3) can be distinguished. The layer 11 is the semi-conductive substrate on which the imager is implanted. This layer 11 thus represents the active part of the imager and comprises photodiodes and their associated control and interconnection circuits (not detailed). The layer 12 is formed by a dielectric material that entirely covers the substrate 11. The layer 13 is a passivating layer deposited on the imager at the end of the CMOS manufacturing process. The layer 14 is formed by colored resins and comprises red, green or blue areas 14-1, 14-2, 14-3 forming the abovementioned primary color filters, with one color filter per pixel. The layer 15 is an intermediate layer of glass or resin forming a base for the microlenses L0 and providing good flatness. The microlenses L0 are arranged in a so-called "MLA" ("Microlens Array") with one microlens per pixel.

The lens 4 of the optical set is generally formed in a mold by means of a polymer resin that is removed from the mold after a baking step. Another known technique of manufacturing the lens 4 involves printing polymer resin on a base, then the resin creeping to obtain a convex (rounded) face.

The microlenses L0 are also manufactured by means of a polymer resin and the method for manufacturing the latter comprises for example steps of depositing a layer of light-sensitive polymer resin (photoresist) onto an imager wafer, a step of soft bake, a step of exposing the layer of resin to an ultraviolet light through an isolation mask and a step of removing the insolated parts with an organic solvent to obtain an array of flat lands. The flat lenses are then subjected to a determined temperature to undergo a thermal creep that renders their upper face convex. They are then hardened by a final operation of annealing.

These manufacturing methods and particularly the method for manufacturing the lens of the optical set using a mold, may be complex, lengthy to implement and costly as a result.

BRIEF SUMMARY OF THE INVENTION

One embodiment of the present invention is a method for manufacturing lenses or microlenses that is an advantageous alternative to the known methods.

One embodiment of the invention is a method for manufacturing a digital image sensor including at least one optical lens using a hardenable liquid or gelatinous material. The method includes depositing a calibrated volume of the material on a lens formation base using a tubular needle of a small diameter, so that the volume of deposited material has at least one convex part under the effect of interface energies, and hardening all or part of the volume of deposited material.

According to one embodiment, the volume of hardened material is used as a lens by leaving it on its initial formation base, which is transparent for this purpose and used as a lens base.

According to one embodiment, the hardening of the volume of material is partial and, after hardening, the lens contains at least one part that is still liquid or gelatinous.

According to one embodiment, the volume of material is deposited on a flat part of the formation base and, before hardening, the lens has a general convex shape under the effect of the interface energies.

According to one embodiment, the volume of material is deposited in a cavity provided in the formation base and, before hardening, the lens has an upper face of convex shape under the effect of the interface energies.

According to one embodiment, the volume of material is deposited on the formation base without the end of the needle entering the volume of material deposited.

According to one embodiment, the volume of material is deposited on the formation base with a distance between the formation base and the end of the needle which is such that the end of the needle is situated inside the volume of material once the latter is deposited.

According to one embodiment, the method comprises a step of injecting at least one gas inside the volume of material, to obtain a lens containing a gas pocket.

According to one embodiment, the method comprises at least one step of injecting another liquid or gelatinous material inside the volume of material deposited, to obtain a composite lens comprising at least two substantially concentric layers having different optical indices.

According to one embodiment, the method comprises the simultaneous deposit of a plurality of volumes of material on the formation base, by means of a plurality of needles of a small diameter, to obtain a lens array.

According to one embodiment, the method comprises several simultaneous or successive steps of simultaneously depositing a plurality of volumes of material on the formation base, by means of a plurality of needles of a small diameter, using different materials, to obtain a composite lens array comprising groups of lenses having different optical properties.

One embodiment of the present invention provides a method for manufacturing a digital image sensor, particularly a CMOS sensor, comprising a step of manufacturing a lens conducted in accordance with an embodiment of the method according to the present invention.

One embodiment of the present invention provides a method for manufacturing a camera, comprising a step of manufacturing an image sensor according to an embodiment of the present invention.

One embodiment of the present invention provides a method for manufacturing an optical set for a digital image sensor, particularly a CMOS sensor, comprising a step of manufacturing a lens conducted in accordance with a embodiment of the method according to the present invention.

BRIEF DESCRIPTION OF THE SEVERAL VIEWS OF THE DRAWINGS

Some embodiments of the present invention will be explained in greater detail in the following description, in relation with, but not limited to the following figures, in which.

DETAILED DESCRIPTION OF THE INVENTION

One embodiment of the present invention includes depositing a fluid or gelatinous hardenable material on a surface to obtain a converging lens shape by using the interface energies that act on the material. The method can be used to produce a lens block of a digital imager such as a CMOS imager or the microlenses of a CMOS imager chip.

Figure 1:
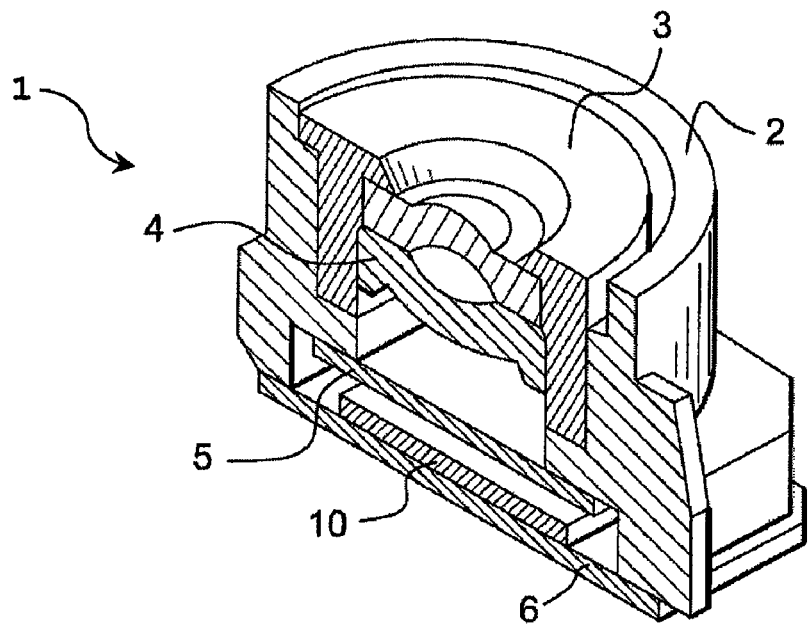
FIG. 1 described above represents a CMOS imager block, according to prior art.
Figure 2:
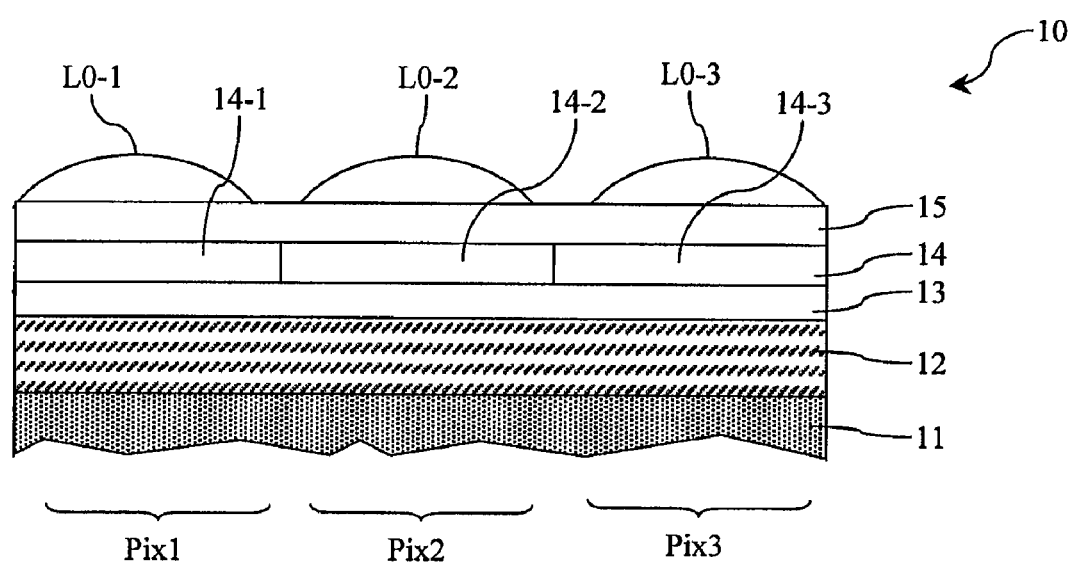
FIG. 2 described above is a cross-section of a CMOS imager chip, according to prior art.
Figures 3A, 3B, 3C:
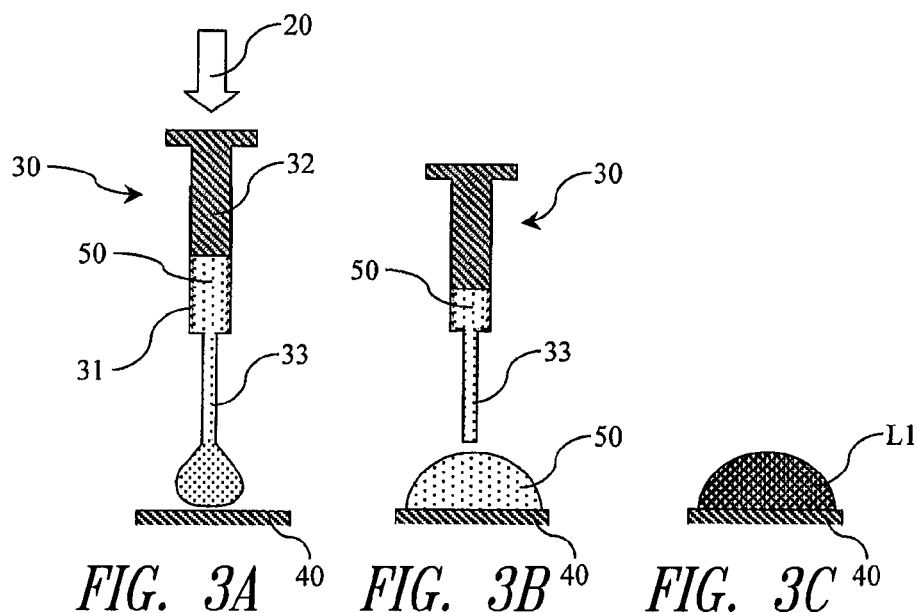
FIGS. 3A to 3C show steps of the method of manufacturing lenses according to an embodiment of the present invention.

In FIGS. 3A, 3B, a dispensing device 30 containing a material to be dispensed 50 is arranged above a lens formation base 40 arranged horizontally. The material 50 is liquid or gelatinous and has a determined viscosity. The material 50 is hardenable by drying or polymerization (the drying being understood here as including the polymerization, for a material polymerizable at ambient temperature and without adding energy).

The dispensing device 30 is for example a syringe equipped with a tubular needle 33. The syringe 30 comprises a tube 31 and a piston 32, the tube ending with an opening onto which the needle 33 is fixed. A syringe-driver 20 (schematically shown by an arrow) applies a translation motion of controlled amplitude to the piston 32, to dispense a determined volume of material 50. The syringe-driver is preferably motorized, for an accurate control of the translation motion.

A determined volume of material 50 is deposited on the base 40, as shown in FIG. 3B. In one embodiment, this "volume of material" has the shape of a drop of water deposited on a waterproof medium. The volume of material 50 is then hardened by drying or polymerization to obtain a lens L1, as represented in FIG. 3C. The lens can be detached from the base 40 to be mounted by gluing or crimping onto a reception base that is for example arranged in the optical set of a CMOS sensor. In another embodiment of the present invention, the lens L1 is not separated from the base 40 and the latter is used as a lens base. In this case, the base 40 is transparent. The base 40 may be a glass wafer, which may be colored or not. The base 40 may also be a "planar" layer of resin (layer of resin used to level semi-conductor or oxide surfaces in microelectronics after formation of components on the semi-conductor) and the lens is directly formed on an imager wafer.

One embodiment of the present invention is thus based on the laws of physics to produce a shape that can be used as a lens. A surface tension, also referred to as interface energy or surface energy, exists at the interface between two environments. As the volume of material 50 is put on the base 40, three environments must be considered here, i.e., the air for the ambient environment (or a gas in the case of an implementation of the method in a controlled gas atmosphere), the liquid (or gel) forming the volume of material 50, and a solid environment formed by the base 40. The shape of the volume of material 50 is therefore determined by three interfaces: gas/liquid (or gas/gel), gas/solid and liquid/solid. The shape of the volume of material 50 results from the balance between the pressure of the gas, the molecular attraction inside the material 50, the weight of the material 50, and the attraction at the liquid/solid interface. The equilibrium interfacial surface energy depends on the surface areas of these three interfaces (energy per unit of surface area or energy surface density). The shape adopted by the volume of material 50 is the one that minimizes the sum of the interface energies between the three environments (the Website http://www.kruss.info gives various information about the interfacial tension and the contact angle of a drop of liquid put on a surface).

Figures 4A, 4B:
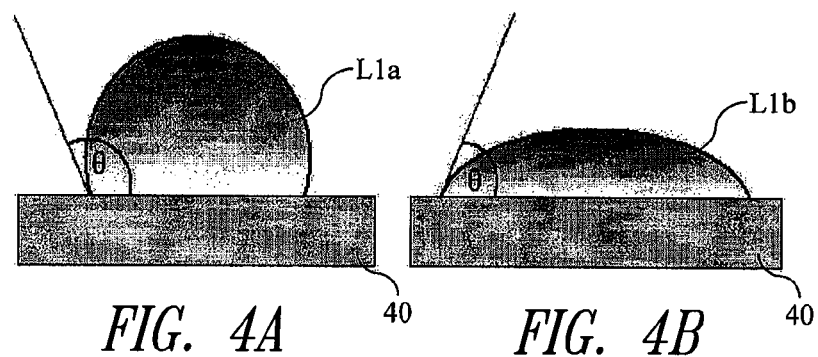
FIGS. 4A, 4B represent two different shapes of lenses which can be obtained according to an embodiment of the present invention.

The shape of the drop obtained is thus situated between two extremes represented in FIGS. 4A and 4B:

1) an ellipsoid shape L1a cut below the equator (FIG. 4A) when the energy density of the solid/liquid interface is high. The volume of material 50 is repelled by the solid base 40 and the surface area of the interface between the material 50 and the base 40 is small, whereas the surface area of the interface between the material 50 and the air is large (the extreme case being a ball shape). The contact angle θ is maximal.

2) an ellipsoid shape L1b truncated above the equator (FIG. 4B) if the spreading of the volume of material 50 requires little energy (the energy density of the solid/liquid interface is low). In this case, the surface area of the interface between the material 50 and the base 40 is large, while that of the interface between the material 50 and the air is small (the most extreme case being a pool shape).

One embodiment of the present invention thus comprises a judicious choice between the viscosity and density parameters of the material 50, the surface state of the base 40, to obtain the desired lens shape. Also, parameters such as the nature of the ambient gas and the ambient pressure can be controlled to modulate the shape of lens obtained. A step of surface treatment (polishing or plasma treatment for example) can also be applied to the base 40 to modulate the lens shape obtained.

The material 50 used to implement one embodiment of the present invention is preferably a polymer or a combination of polymers, or a compound containing a polymer or a combination of polymers added to a binder. Different materials can be added to it, for example magnetic flakes. The material is for example epoxy, a passivating material referred to as "glass" used in microelectronics, a glue, etc. Prototypes of lenses according to an embodiment of the present invention have particularly been produced with a glue referenced "OGR150THTG" and marketed by Ablestick (professional product intended for microelectronics). Generally speaking and subject to testing within the understanding of those skilled in the art, any hardenable liquid or gel material can be used to implement an embodiment of the present invention, provided it does not become opaque when hardened. The material 50 can be transparent or colored. It can be electrically insulating or conductive.

The hardening of the lens L1 can be obtained by thermal treatment (according to the conditions of polymerization of the products used), by using a source of ultra-violet light (according to the conditions of polymerization of the products used) and generally speaking any known hardening method applicable to the liquid or gelatinous material used. The hardening can also be only partial. In this case, a part that is still liquid or viscous remains in the core of the lens.

Figure 5:
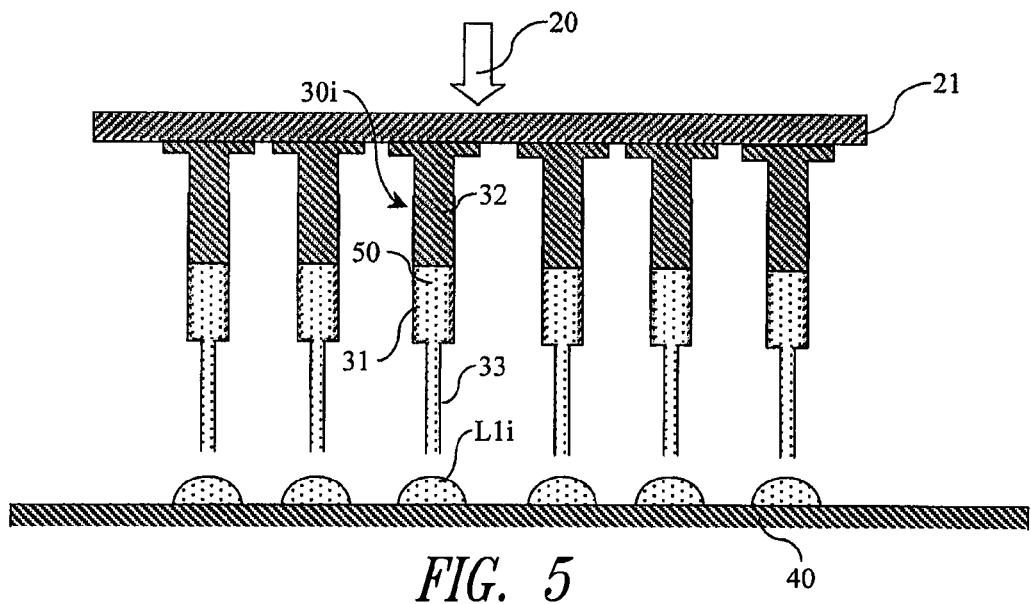
FIG. 5 represents a device allowing lenses to be manufactured collectively in accordance with an embodiment of the present invention.

To obtain satisfactory manufacturing rates, several lenses L1$i$ are preferably produced simultaneously by using a plurality of syringes 30$i$, as shown in FIG. 5. The quantity of material 50 dispensed by each syringe is controlled here by disposing between the syringe-driver 20 and the plurality of syringes 30$i$ a plate 21 that simultaneously pushes the pistons of all the syringes. Other embodiments of the present invention allowing lenses to be produced collectively will be described below in relation with FIGS. 16 and 17.

Various embodiments of lens arrays according to the invention are represented in FIGS. 6 to 9B.

Figure 6:
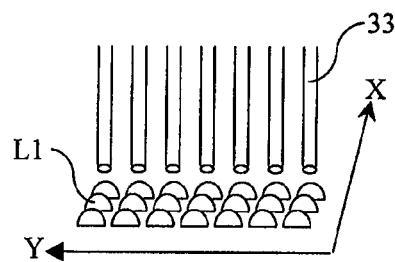
FIGS. 6, 7, 8, 9A and 9B represent different lens arrays produced by an embodiment of the present invention.

In FIG. 6, a single row of dispensing needles 33 is used to produce a first row of lenses L1, then the base surface is moved in X and/or Y and the operation is repeated several times to obtain the lens array.

Figure 7:
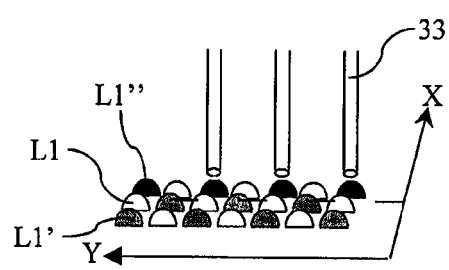

In FIG. 7, a single row of dispensing needles 33 is also used, to produce here first rows of lenses L1 with a first hardenable material, then the base surface is moved in X and/or Y and the operation is repeated several times using a second hardenable material then a third hardenable material, to obtain a composite lens array of L1, L1', L1" type, each type of lens being made up of a different material and having different optical properties. As represented, the rows of lenses L1, L1' and L" can be interlinked by using needles 33 the spacing of which is greater than the spacing between two lenses of the array.

Figure 8:
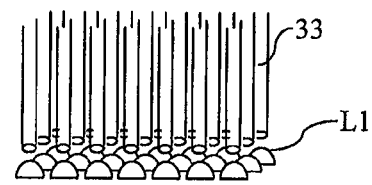
Figure 9A:
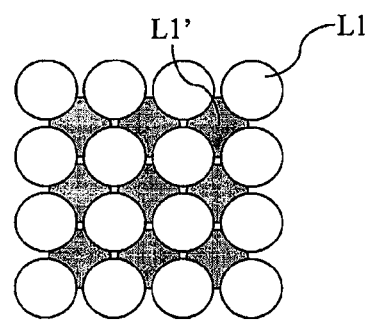
Figure 9B:
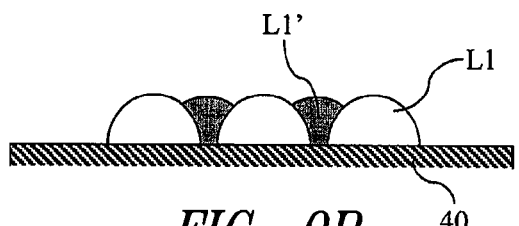

In FIG. 8, an array of dispensing needles 33 is used to produce a lens array L1 in a single step.

The array of lenses can be produced such that lenses overlap. As represented by a top view in FIG. 9A and in a cross-section in FIG. 9B, a composite array comprising lenses of L1 type and lenses of L1' type is produced for example and in which the lenses of L1' type overlap the lenses of L1 type. For this purpose, the array comprising lenses of L1 type is first of all formed and polymerized before producing the array comprising lenses of L1' type, which is then itself polymerized. The conditions of polymerizing each lens array are not necessarily identical and depend on the material used to produce each array.

It will be understood that a large number of alternative embodiments can be designed by those skilled in the art from the examples described. Moreover, the lens array does not necessarily have a regular pitch.

The production of a lens array on a common formation base involves the lenses then being detached from the base or the base, in glass or resin, being cut into chips each comprising a lens. The latter embodiment is particularly suited to the production of a lens array on a semi-conductor wafer, after depositing a lens base layer on an imager array integrated onto the wafer. In this case, this is a "full" image sensor (imager integrated onto semi-conductor and its associated optical set) that is advantageously produced collectively.

Figures 10A, 10B:
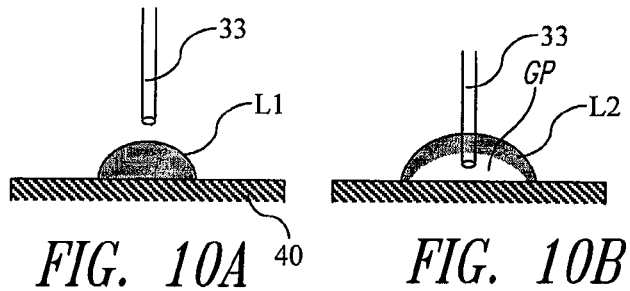
FIGS. 10A, 10B and 11A, 11B show one embodiment of the present invention allowing a gas-charged lens to be produced.

FIGS. 10A, 10B show one embodiment of the invention allowing a lens L2 comprising a gas pocket GP that changes its optical properties to be produced. In FIG. 10A, a lens L1 (not hardened) is formed in the manner described above. In the step shown in FIG. 10B, the end of the needle 33 is driven into the lens L1 and a quantity of gas is injected into the lens, to obtain the lens L2 before the hardening step.

Figures 11A, 11B:
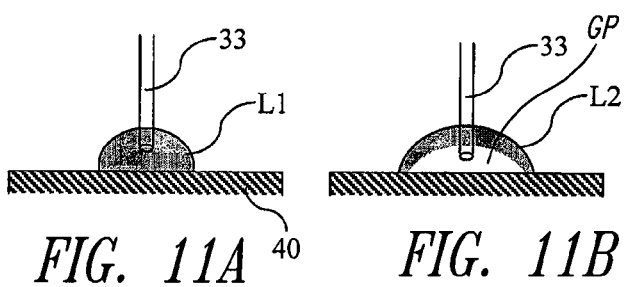

In an alternative shown in FIG. 11A, 11B, the needle 33 is brought sufficiently close to the base 40 so that its distal end is situated inside the lens L1 after the latter is formed. The next step, shown in FIG. 11B, is identical to the one shown in FIG. 10B but does not require the needle to be introduced a posteriori into the lens L1 to inject the gas.

FIGS. 12A to 12C, 13A, 13B show one embodiment of the invention wherein the base surface 40 includes a cavity 41 (or several cavities) for receiving the lens to be produced (or the lenses to be produced collectively). Such a cavity is easy to produce on a semi-conductor base 40. An intermediate layer, for example an oxide layer 40', is produced on the semi-conductor 40. The oxide layer 40' is then etched to form the cavity 41 and is then covered with a resin 40".

Figures 12A, 12B, 12C:
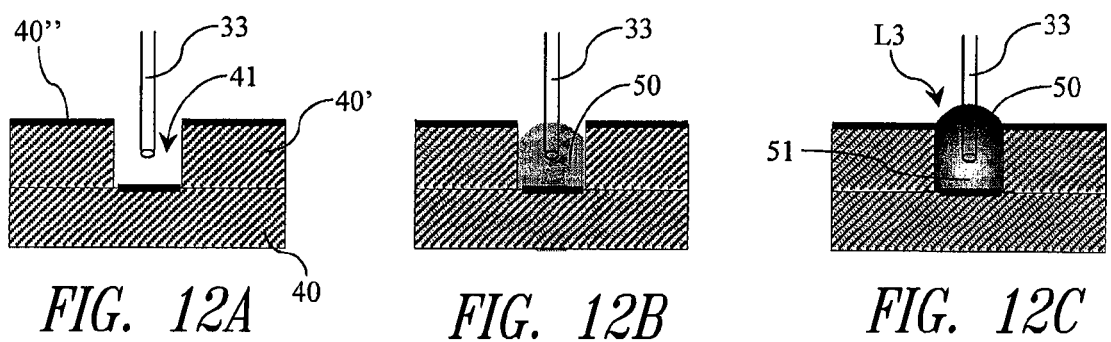
FIGS. 12A to 12C show one embodiment of the present invention allowing a composite lens to be produced.

This embodiment enables for example a lens having a base of a shape different from the usually round shape of a lens to be produced, for example a square-based lens. Such a shape is advantageously more suited to the square shape of the pixel array of an imager. Moreover, lenses including a gas or materials with different optical indices can be produced. Thus, FIGS. 12A to 12C show the manufacturing of a composite lens L3. In the step in FIG. 12A, the needle 33 is brought to the cavity 41 so that its distal end enters the cavity. In the step shown in FIG. 12B, the material 50 is deposited in the cavity. The distal end of the needle 33 is then located inside the volume of material 50. In the step shown in FIG. 12C, a second liquid or gelatinous material 51 is injected into the material 50, thus creating a lens core with an optical index different from the rest of the lens L3. Other materials can be injected into the lens, for example to obtain an optical index gradient. The materials closest to the core of the lens are not necessarily hardened. They can even be of a non-hardenable type.

Figures 13A, 13B:
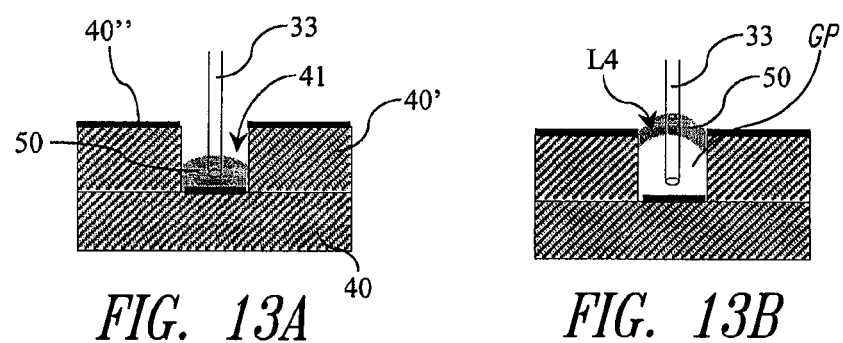
FIGS. 13A to 13B show one embodiment of the present invention allowing a gas-charged lens to be produced.

In FIGS. 13A and 13B, similar steps are implemented to inject a gas pocket into the lens instead of injecting the second material 51. A lens L4 is obtained that contains a gas pocket GP, like the lens L2 in FIG. 10B or 11B.

Those skilled in the art will note that in the various embodiments using a cavity, the shape of all or part of the lateral edges of the lens is imposed by the walls of the cavity. Only the upper face of the lens subject to the interfacial forces without any mechanical compensation has a convex shape.

Figures 14A, 14B, 14C:
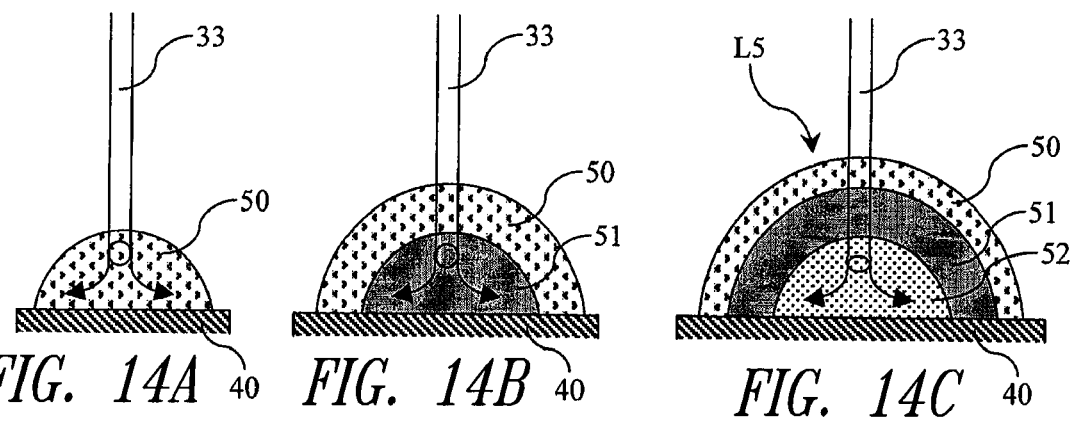
FIGS. 14A to 14C show one embodiment of the present invention allowing a composite lens with index variation to be produced.

A composite lens L5 with several optical indices can also be produced in the manner represented in FIGS. 14A to 14C. In FIG. 14A, a first quantity of material 50 is deposited by means of the needle 33 on a perfectly flat base surface 40. As described above, the distal end of the needle is arranged here so as to be in the core of the quantity of material 50 when the latter is deposited on the base 40. In FIG. 14B, a quantity of material 51 is injected into the core of the material 50 and in FIG. 14C another quantity of material 52 is injected into the core of the material 51. Going from the external environment to the core of the lens L5, concentric layers of material 50, then of material 51, and finally of material 52 are thus found.

Figure 15:
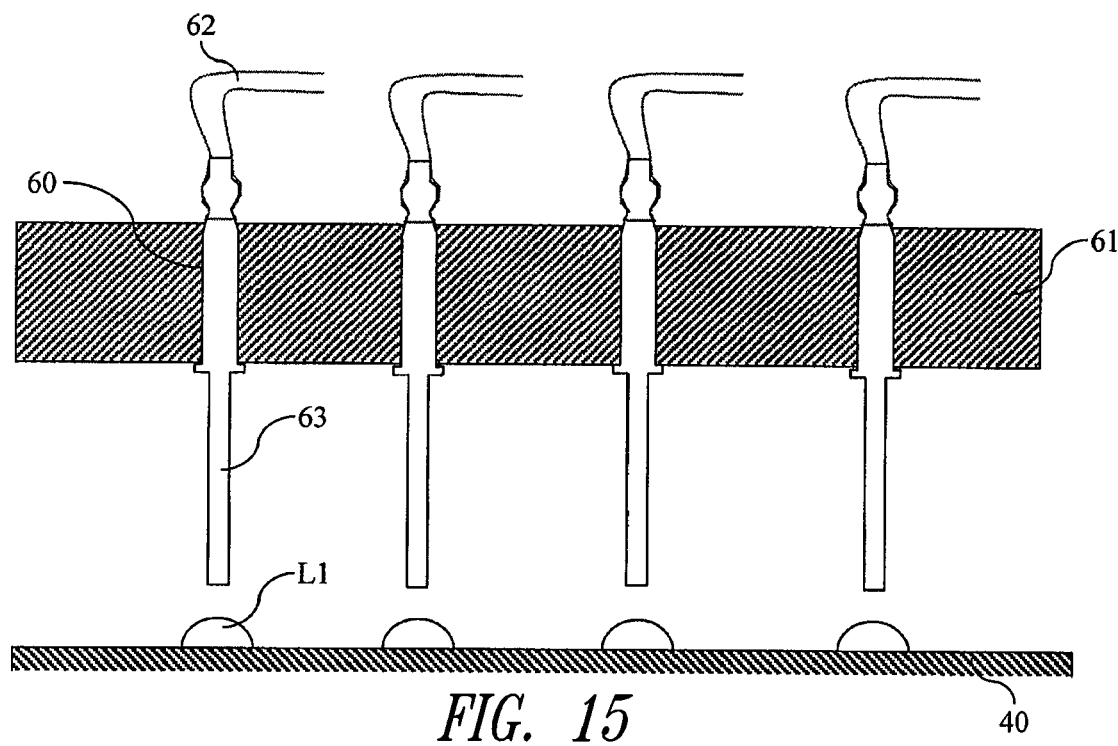
FIG. 15 represents an embodiment of a device allowing lenses to be produced collectively in accordance with an embodiment of the present invention.

FIG. 15 represents a dispensing device comprising a plurality of dispensing nozzles 60 held by a plate 61 and each linked to a pipe 62 that is supplied with liquid or gelatinous material 50 by a fluidic micro-pump (not represented). Each nozzle 60 comprises an end 63 of a small diameter having the same function as a dispensing needle and extending downwards towards the base 40. In an embodiment of the present application and the claims, "needle" thus means any means for dispensing the liquid or gelatinous material, for example, the nozzles 60 that have just been described.

It will be understood by those skilled in the art that various applications and other alternative embodiments of the method according to the present invention are possible, particularly by combining the examples of embodiments that have just been described.

One embodiment of the present invention is particularly applicable to the production of digital image sensors or to the production of optical sets for image sensors, CMOS sensors for example, particularly within the context of the manufacturing of cameras or of photographic modules integrated into cellular telephones. Concerning the choice of materials, those skilled in the art will note that the use of non-miscible materials enables variable index lenses to be obtained while the use of miscible materials enables lenses having an index gradient to be obtained, an appropriate step of polymerization being conducted once the lenses have been produced.

Figure 16:
FIG. 16 represents an alternative of a hardening step represented in FIG. 3C, according to an embodiment of the present invention.

Materials known per se to have shrinkage properties during their polymerization can also be used, for example glues. Such materials enable the size of the deposited lens to be reduced, without destroying the initial shape of the lens, imposed by the interface energies. For a better understanding, FIG. 16 represents an alternative to the step of hardening the lens L1 represented in FIG. 3C. FIG. 16 shows the decrease in the lens size during a step of thermal polymerization when a material with a high shrinkage rate is used to produce the lens L1.

Figure 17:
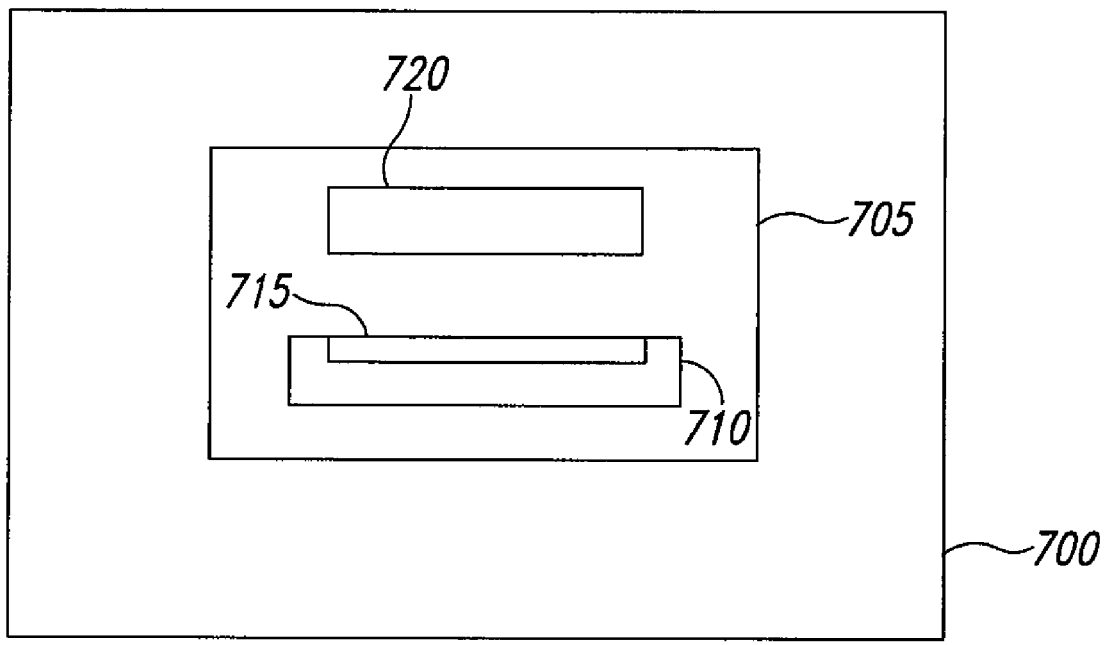
FIG. 17 illustrates a portable device, according to an embodiment of the present invention.

FIG. 17 illustrates a portable device 700, according to an embodiment of the invention. The portable device 700 includes a photographic module 705 and a semiconductor chip 710 integrating a digital image sensor 715. In one embodiment, the digital image sensor 715 is a CMOS sensor. The portable device 700 may be a mobile telephone, a camera or a video camera, for example. As known to one of skill in the art, the photographic module 705 includes an optical block 720 having one or more optical lenses. The photographic module 705 is configured to hold the semiconductor chip 710 such that electromagnetic energy incident upon the optical block 720 is directed onto the digital image sensor 715 of the semiconductor chip 710.

The invention claimed is:

1. A method for manufacturing a digital image sensor, comprising:
   manufacturing an optical lens by steps including:
   depositing a volume of a first hardenable material on a lens formation base using a tubular needle of a small diameter, so that the deposited volume of first hardenable material has at least one convex part under the effect of interface energies;
   injecting at least one gas inside the deposited volume of first hardenable material so that the optical lens includes a gas pocket; and
   hardening at least a part of the deposited volume of first hardenable material, wherein the hardening includes partially hardening the deposited volume of first hardenable material such that, after hardening, the deposited volume of first hardenable material includes at least one part that is liquid or gelatinous.

2. The method according to claim 1, wherein the lens formation base is transparent and the method includes leaving the hardened deposited volume of first hardenable material on the lens formation base, wherein the lens formation base and the hardened deposited volume inseparably form the lens.

3. The method according to claim 1, wherein the first hardenable material is selected from the group consisting of a hardenable liquid material and a hardenable gelatinous material.

4. The method according to claim 1, wherein the depositing includes depositing the volume of first hardenable material on a flat part of the formation base and, before hardening, the deposited volume of first hardenable material has a general convex shape under the effect of the interface energies.

5. The method according to claim 1, wherein the depositing includes depositing the volume of first hardenable material in a cavity provided in the formation base and, before hardening, the deposited volume of first hardenable material has an upper face of convex shape under the effect of the interface energies.

6. The method according to claim 1, wherein the depositing includes depositing the volume of first hardenable material on the formation base without an end of the needle entering the volume of first hardenable material deposited.

7. The method according to claim 1, wherein the depositing includes depositing the volume of first hardenable material on the formation base with a distance between the formation base and an end of the needle such that the end of the needle is situated inside the deposited volume of first hardenable material.

8. The method according to claim 1, further comprising injecting a second hardenable material inside the deposited volume of first hardenable material to obtain a composite lens including at least two substantially concentric layers having different optical indices.

9. The method of claim 8, wherein the second hardenable material is selected from the group consisting of a hardenable liquid material and a hardenable gelatinous material.

10. The method according to claim 1, further comprising simultaneously depositing a plurality of volumes of first hardenable material on the formation base, using a plurality of needles of a small diameter, to obtain a lens array.

11. The method according to claim 1, further comprising simultaneously depositing a plurality of volumes of a plurality of hardenable material on the formation base, using a plurality of needles of a small diameter, to obtain a composite lens array including groups of lenses having different optical properties.

12. The method according to claim 1, further comprising successively depositing a plurality of volumes of a plurality of hardenable material on the formation base, using a plurality of needles of a small diameter, to obtain a composite lens array including groups of lenses having different optical properties.

13. A method for manufacturing a digital image sensor, comprising:
   forming an optical lens, including:
      depositing a volume of a hardenable first material on a lens formation base using a tubular needle of a small diameter, so that the deposited volume of hardenable first material has at least one convex part under the effect of interface energies;
      injecting a second material in the deposited volume of hardenable first material while an end of the needle is positioned in the deposited volume of hardenable first material; and
      hardening at least a part of the deposited volume of hardenable first material.

14. The method of claim 13, wherein the hardenable first material is a hardenable liquid.

15. The method according to claim 14, wherein after hardening, the deposited volume of hardenable first material includes at least one part that is liquid.

16. The method according to claim 13, wherein depositing further comprises depositing the volume of first hardenable material in a cavity provided in the formation base and, before hardening, the deposited volume of hardenable first material has an upper face of convex shape under an effect of interface energies.

17. The method according to claim 13, wherein depositing further comprises depositing the volume of hardenable first material on the formation base with a distance between the formation base and the end of the needle such that the end of the needle is situated inside the deposited volume of first hardenable material.

18. The method according to claim 13, wherein forming the optical lens includes forming a gas pocket in the optical lens by injecting a gas as the second material inside the deposited volume of hardenable first material, and hardening the deposited volume of hardenable first material with the gas inside the deposited volume of hardenable first material.

19. The method according to claim 13, wherein the optical lens is a composite lens including substantially concentric layers having different optical indices, the composite lens being formed by injecting a hardenable material, as the second material, inside the deposited volume of hardenable first material and hardening the second material along with the first material.

20. The method according to claim 13, wherein the digital image sensor is a CMOS sensor.

21. A method for manufacturing a portable device, comprising:
   manufacturing an image sensor, including:
      manufacturing an optical lens, including:
         depositing a volume of a hardenable first material on a lens formation base using a tubular needle of a small diameter, so that the deposited volume of hardenable first material has at least one convex part under the effect of interface energies;
         injecting a second material in the deposited volume of hardenable first material while an end of the needle is positioned in the deposited volume of hardenable first material; and
         hardening at least a part of the deposited volume of hardenable first material.

22. The method of claim 21, wherein the hardenable first material is a hardenable gelatinous material.

23. The method according to claim 21, wherein depositing further comprises depositing the volume of hardenable first material in a cavity provided in the formation base and, before hardening, the deposited volume of hardenable first material has an upper face of convex shape under the effect of the interface energies.

24. The method according to claim 21, wherein depositing further comprises depositing the volume of hardenable first material on the formation base with a distance between the formation base and an end of the needle selected such that the end of the needle is situated inside the deposited volume of hardenable first material.

25. The method according to claim 21, wherein the optical lens is a composite lens including substantially concentric layers having different optical indices, the composite lens being formed by injecting a hardenable material, as the second material, inside the deposited volume of hardenable first material and hardening the second material along with the first material.

26. The method according to claim 21, wherein the image sensor is a CMOS sensor.

27. The method according to claim 21, wherein the optical lens is one of a plurality of optical lenses of an optical block for the image sensor.

28. The method according to claim 21, wherein manufacturing the optical lens includes forming a gas pocket in the optical lens by injecting a gas, as the second material, inside the deposited volume of hardenable first material, and hardening the deposited volume of hardenable first material with the gas inside the deposited volume of hardenable first material.

* * * * *